United States Patent [19]
Thibaudeau

[11] Patent Number: 5,909,812
[45] Date of Patent: Jun. 8, 1999

[54] CONTAINER FOR STORING AND TRANSPORTING LEADFRAMES

[75] Inventor: Normand Thibaudeau, North Providence, R.I.

[73] Assignee: Plastic Development, Inc., Pawtucket, R.I.

[21] Appl. No.: 08/958,552

[22] Filed: Oct. 29, 1997

Related U.S. Application Data

[63] Continuation-in-part of application No. 08/727,115, Oct. 8, 1996, abandoned.

[51] Int. Cl.$^6$ .................................................. B65D 85/00
[52] U.S. Cl. ........................... 206/723; 206/722; 206/701
[58] Field of Search .................................... 206/449, 701, 206/722, 723, 724, 725

[56] References Cited

U.S. PATENT DOCUMENTS

| | | | |
|---|---|---|---|
| 3,524,541 | 8/1970 | Nelson | ..................................... 206/725 |
| 4,696,395 | 9/1987 | Rivoli . | |
| 4,776,462 | 10/1988 | Kosugi et al. . | |
| 5,016,752 | 5/1991 | Haugen, Jr. . | |
| 5,026,303 | 6/1991 | Matsuoka et al. . | |
| 5,154,292 | 10/1992 | Bartucca et al. | ......................... 206/449 |
| 5,353,934 | 10/1994 | Yamauchi . | |
| 5,597,074 | 1/1997 | Ko | ........................................... 206/725 |
| 5,707,537 | 1/1998 | Bartha et al. | ............................ 206/725 |

*Primary Examiner*—David T. Fidei
*Attorney, Agent, or Firm*—Salter & Michaelson

[57] ABSTRACT

A container for storing and transporting articles, such as leadframes. The container includes a base with a planar wall having an upwardly facing surface defined by a peripheral edge, and at least two upwardly extending, opposite posts secured to the upper surface of the planar wall. The posts are spaced interiorly from the peripheral edge of the upwardly facing surface wherein each post has an outwardly facing surface and an inwardly facing surface that is tapered outwardly from the top of the post to the bottom of the post. The articles are positioned between the inwardly facing surfaces of the posts. A cover is releasably securable to the planar wall of the base. The cover includes a top wall and a peripheral, downwardly extending wall formed to the outer periphery of the top wall. The peripheral wall is positioned adjacent the peripheral edge of the upwardly facing surface of the base and outwardly with respect to the posts of the base when securing the cover to the base.

16 Claims, 3 Drawing Sheets

5,909,812

CONTAINER FOR STORING AND TRANSPORTING LEADFRAMES

CROSS-REFERENCE TO RELATED APPLICATION

This application is a continuation-in-part of application Ser. No. 08/727,115, which was filed on Oct. 8, 1996 now abandoned and entitled CONTAINER FOR STORING AND TRANSPORTING LEADFRAMES AND A PROCESS FOR MANUFACTURING THE SAME.

BACKGROUND OF THE INVENTION

This invention relates generally to containers for storing and transporting articles, and more particularly to a container which is capable of receiving a plurality of leadframes therein.

Oftentimes fragile articles, such as leadframes, requiring to be stored and/or transported are placed in bulky packaging which is designed to protect the articles. Although many of these packages are effective in maintaining the articles in a safe condition, they are difficult to handle due to their awkward size and shape, and are difficult to open. For leadframes, the packages are usually box-shaped, and sized for accommodating the leadframes securely therein.

One problem associated with such leadframe packages is that since they are fabricated from injection molded plastic, a new package design must be created for leadframes having varying shapes and sizes. Thus, for example, a leadframe having dimensions in plan view of two by nine inches would require a different and separate package than a leadframe that is three by nine inches. There is presently a need in the container art for a single container which can be easily manipulated so as to accommodate varying leadframe sizes.

SUMMARY OF THE INVENTION

In general, the present invention is directed to a container for storing and transporting articles, such as leadframes. The container comprises a base including a planar wall having an upwardly facing surface defined by a peripheral edge, and at least two upwardly extending, opposite posts secured to the upper surface of the planar wall. The posts are spaced interiorly from the peripheral edge of the upwardly facing surface wherein each post has an outwardly facing surface and an inwardly facing surface that is tapered outwardly from the top of the post to the bottom of the post. The articles are positioned between the inwardly facing surfaces of the posts. A cover is releasably securable to the planar wall of the base. The cover includes a top wall and a peripheral, downwardly extending wall formed to the outer periphery of the top wall. The peripheral wall is positioned adjacent the peripheral edge of the upwardly facing surface of the base and outwardly with respect to the posts of the base when securing the cover to the base.

More specifically, the inwardly facing surface is tapered approximately one degree with respect to a vertical plane. In addition, the top wall of the cover has a lower surface with at least two downwardly projecting detent members, one for each post. Each detent member engages a post for slightly flexing the post inwardly so that the inwardly facing surface of the post achieves a substantially vertical plane.

Accordingly, among the several objects of the present invention are the provision of a container for storing and/or transporting leadframes, which is capable of receiving leadframes of varying shapes and sizes; the provision of such a container which prevents unwanted electrical charges from contaminating the articles contained therein; the provision of such a container which is simple to use since it enables a person to easily open and close the container for accessing the leadframes therein, and to easily dispose and remove the leadframes therefrom; the provision of such a container which is easy to manufacture; and the provision of such a container which is compact in design and light-weight.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

Corresponding reference numerals designate corresponding parts throughout the several views of the drawings.

DETAILED DESCRIPTION OF THE PREFERRED EMBODIMENT

Figure 1:
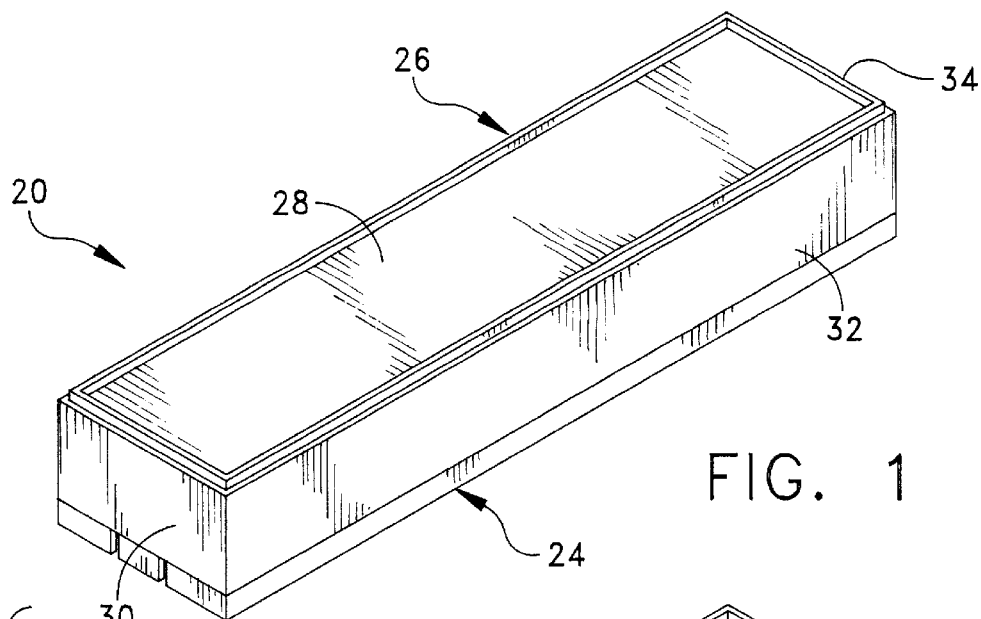
FIG. 1 is a perspective view of a container of the present invention for storing and/or transporting leadframes (not shown)
Figure 2:
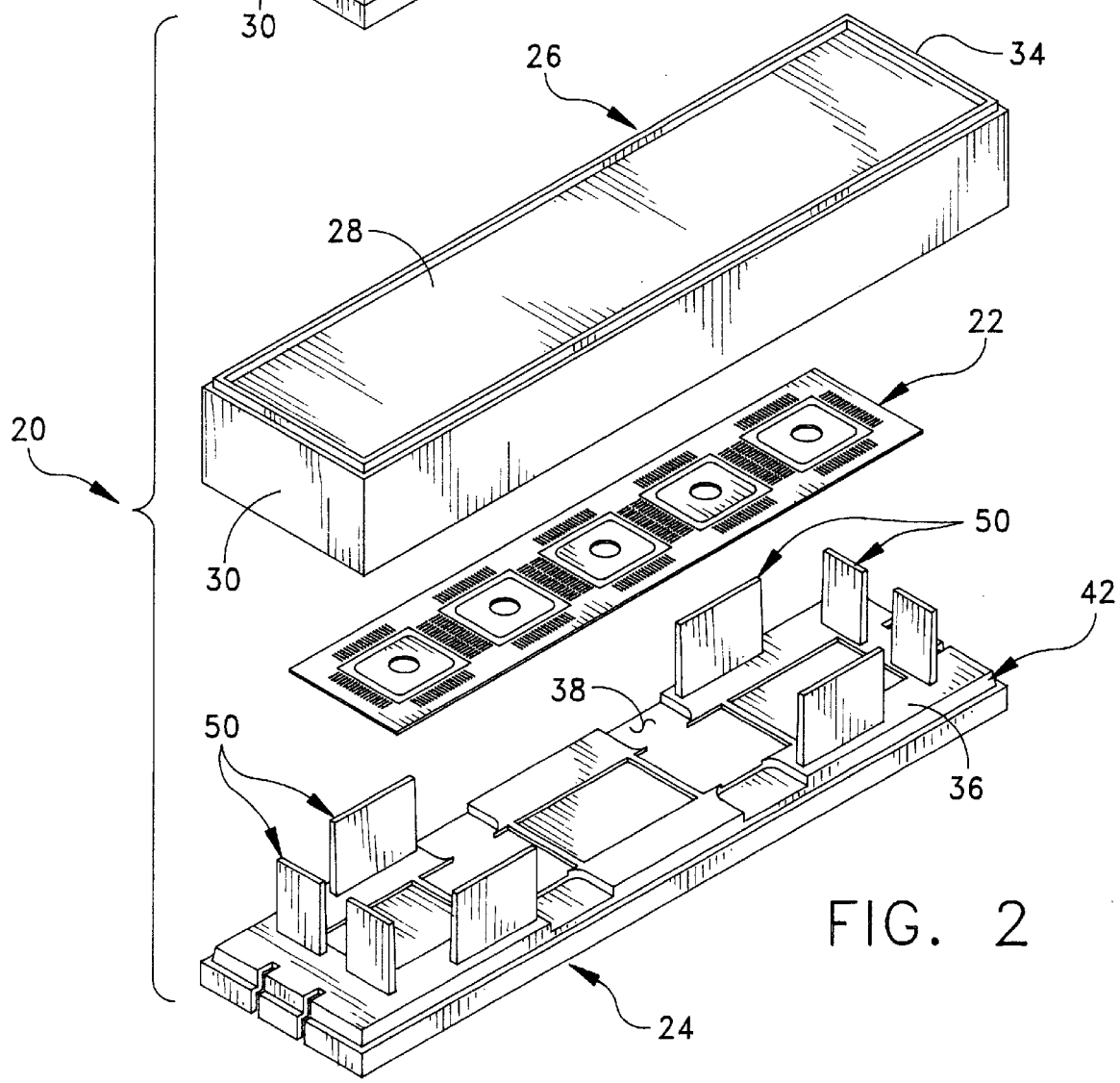
FIG. 2 is an exploded perspective view of the container shown in FIG. 1 illustrating a base and cover thereof in spaced relation, a leadframe being illustrated between the base and cover.

Referring now to the drawings, and more particularly FIGS. 1 and 2, there is generally indicated at 20 a container of the present invention which is especially suited for storing and/or transporting leadframes, a leadframe being generally indicated at 22 in FIG. 2. Leadframes are well-known in the art of stamping and photo and chemical etching of computer chips. As shown, the leadframe 22 is thin and rectangularly-shaped, and preferably fabricated from metallic material. The container 20 is designed to receive a plurality of leadframes in stacked relation, and is especially suited in shipping or transporting the same.

Still referring to FIGS. 1 and 2, and especially to FIG. 2, the container comprises a base, generally indicated at 24, and a cover, generally indicated at 26, which is releasably securable to the base 24. Preferably, the base 24 and the cover 26 of the container 20 are fabricated from any suitable polymeric material, such as ABS, having electrostatic dissipating properties which prevents unwanted electrical charges from contaminating the leadframes contained therein. The fabrication of the container 20, and especially the base 24 of the container, will be described in greater detail below when describing a method of making the container.

Still referring to FIGS. 1 and 2, the cover 26 of the container includes a rectangularly-shaped top wall 28, a pair of downwardly extending end walls, each indicated at 30, and a pair of downwardly extending side walls, each indicated at 32, which together define an outer peripheral wall of the cover. A molding strip 34 is formed on the upper surface of the top wall 28 in the manner shown in FIG. 2 for enabling the container to easily stack with other identically constructed containers. The cover 26 is sized and shaped for being releasably secured to the base 24 in the fashion described below.

Figure 3:
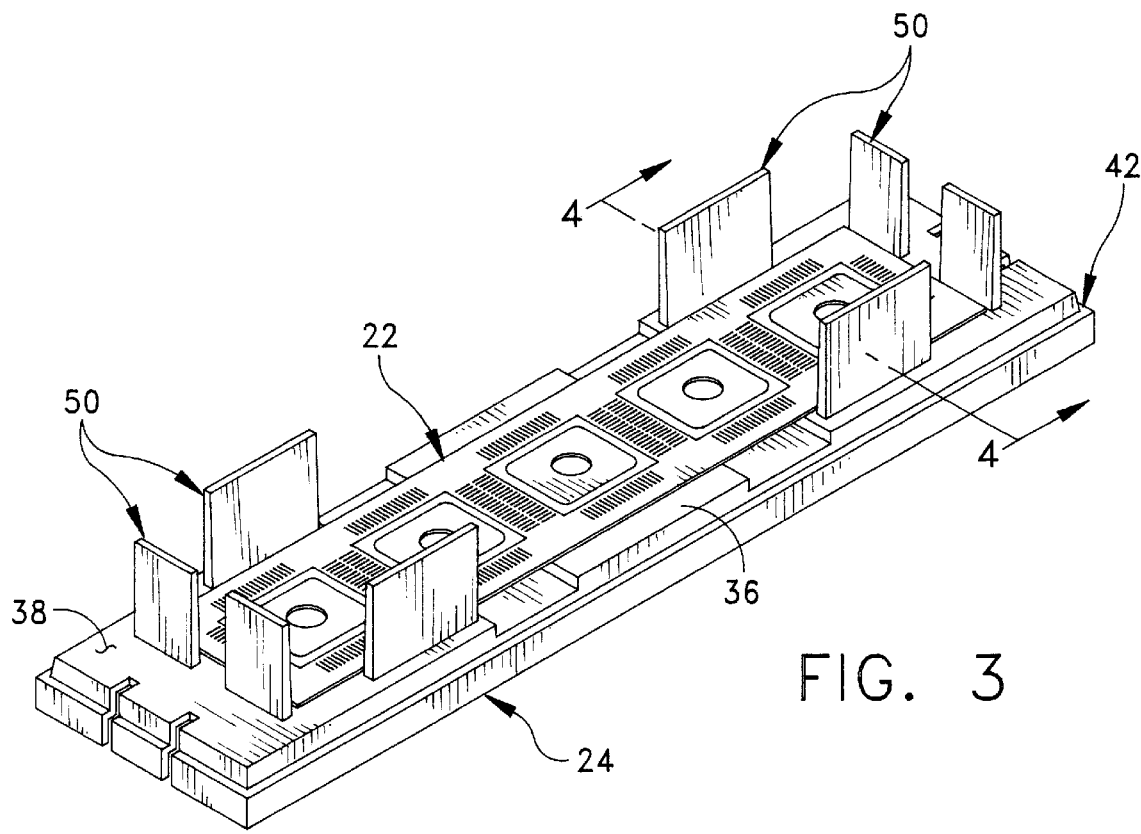
FIG. 3 is a perspective view of the base of the container illustrating the leadframe positioned therewithin.
Figure 4:
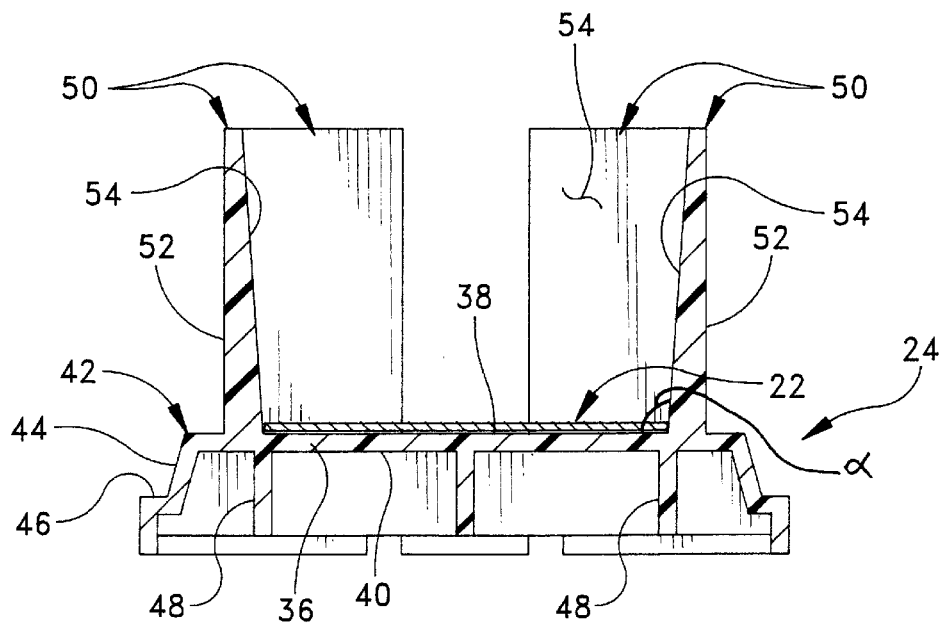
FIG. 4 is a cross-sectional view of the base of the container taken along Line 4—4 of FIG. 3.

Referring to FIGS. 3 and 4, the base 24 includes a generally planar wall 36 that has an upwardly facing surface 38 and a downwardly facing surface 40. The planar wall 36 of the base 24 has a step formation, generally indicated at 42, formed around its periphery. The step formation 42 has a sloped, outwardly facing surface 44 and a horizontal surface 46. The arrangement is such that the lower edge of the outer peripheral wall of the cover (formed by walls 30 and 32) engages the horizontal surface 46 and is generally in face-to-face relation with the outwardly facing surface 44 when attaching the cover 26 to the base 24. The lower portion of the step formation 42 is open (see FIGS. 5 and 9) for receiving the molding strip 34 in the manner described above.

As shown in FIG. 4, formed integrally with the downwardly facing surface 40 of the planar wall 36 is a plurality of structural members 48, which reinforce and strengthen the planar wall of the base 24. The structural members 48 are integrally formed with the peripheral step formation 42 at their terminal ends.

In prior art containers, the cover and base are designed so as to securely receive therein the leadframes in a position that the peripheral outer walls of the cover engage the edges of the leadframes. Thus, for leadframes of different shapes and sizes, new containers, having dimensions corresponding to the particular shape and size of the leadframe, must be fabricated. The base 24 of the container 20 of the present invention is designed to accommodate leadframes of varying shapes and sizes without having to change the overall dimensions of the base 24 and cover 26.

The base 24 further includes eight symmetrically arranged, upwardly extending posts, each generally indicated at 50, which are integrally formed and secured to the upper surface 38 of the planar wall 36 of the base 24. The posts located along the long sides of the base 24 are constructed identically as the posts located along the short ends thereof. The only difference is that the side posts are slightly longer in length than the end posts. As illustrated, the posts 50 are spaced interiorly from the peripheral edge of the surface 38.

As best shown in FIG. 4, each post 50 has an outwardly facing surface 52 and an inwardly facing surface 54. Each post 50 is slightly tapered from the bottom of the post to the top of the post. The outwardly facing surface 52 of the post 50 is perpendicular with respect to the upper surface 38 of the planar wall 36 of the base 24. The inwardly facing surface 54 is formed relative to upper surface 38 such that an obtuse angle α is formed between inner surface 54 and upper surface 38. Preferably, the angle α is approximately 91°, however, a range of 91°–96° is acceptable. The bottoms of the posts 50 are spaced apart from one another distances corresponding to the length of the leadframe and the width thereof. During the fabrication of the base 24, the slight taper in the posts 50 can be achieved as a result of the molding process.

Figure 5:
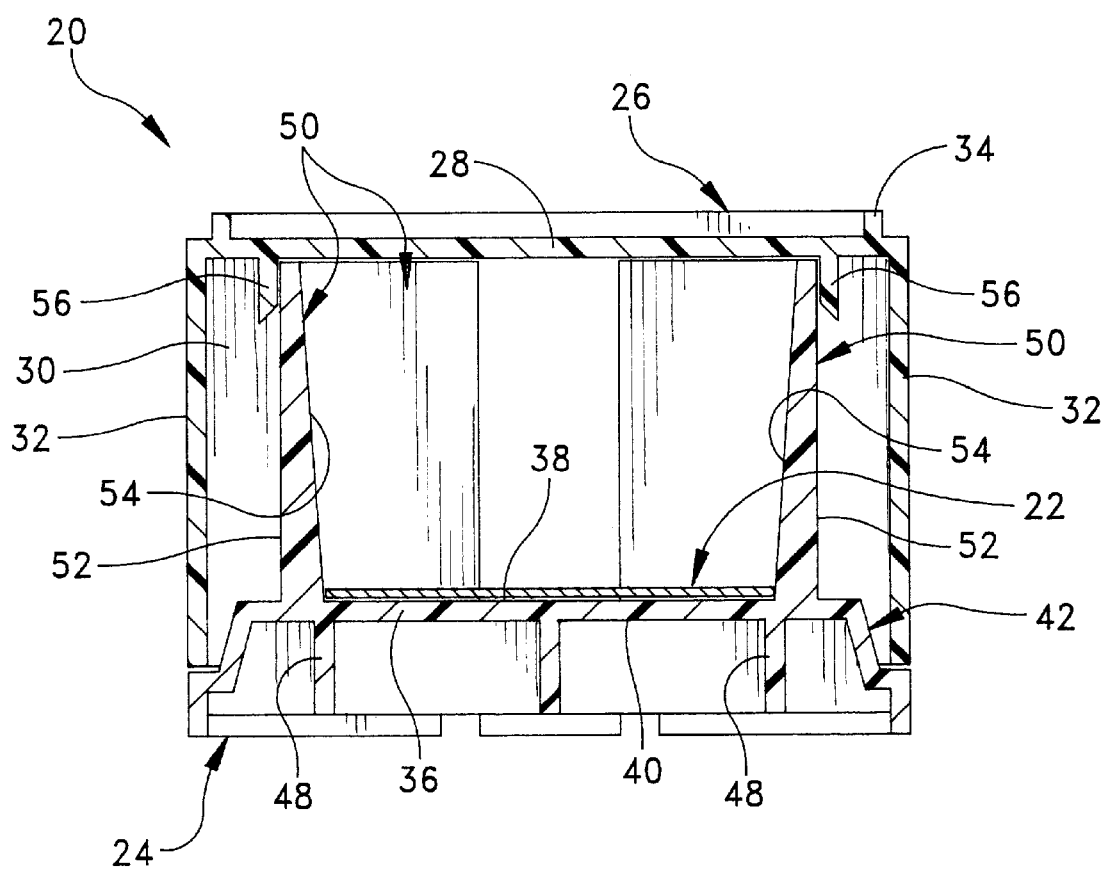
FIG. 5 is a cross-sectional view similar to FIG. 4 illustrating the cover secured to the base.

Referring to FIG. 5, the lower surface of the top wall 28 of the cover 26 has a plurality of downwardly projecting detent members, each indicated at 56. As shown, the detent members 56 engage the posts 50 for slightly bending the posts 50 inwardly so that the inwardly facing surfaces 54 of the posts 50 achieve a vertical plane. The lower ends of the detent members 56 are beveled so that they slidingly engage the posts 50 upon first engaging the posts.

FIG. 5 illustrates opposite side posts 50 engaging opposite side edges of the leadframe 22. It should be understood that the posts 50 located at the opposite ends of the base 24 are constructed identically and are bent inwardly by the detent members 56 in the same manner as the illustrated side posts. The inward flexing motion of the posts 50 positively captures the leadframes 22 so as to prevent the leadframes located near the upper ends of the posts 50 from rattling and moving with respect to the posts and the base 24. The posts 50, in their flexed condition, extend along a vertical plane, and thus maintain engagement with the leadframes 22 along the entire length of the posts 50.

In operation, the posts 50 are in their relaxed condition as illustrated in FIG. 4. The taper of the inwardly facing surfaces 54 of the posts 50 enables the easy insertion and removal of leadframes 22. Once the space between the posts 50 is filled with leadframes 22, the cover 26 is secured to the base 24 in the manner depicted in FIG. 5. As shown therein, the detent members 56 engage the upper ends of the posts 50 to flex the posts 50 inwardly so that the inwardly facing surface 54 lies along a generally vertical plane. The flexing action of the posts 50 ensure the positive securement of the leadframes 22 within the container 20. Upon removing the cover 26, the leadframes 22 can be easily removed from the base 24 since the taper creates a slight space around the periphery of the leadframes 22.

It should be noted that bases having different post patterns can be achieved. Such different post patterns are designed to receive leadframes 22 having different dimensions. For example, the base 24 illustrated in FIGS. 1–5 is capable of receiving a leadframe 22 having a lengthwise dimension of 6¼ inches and a widthwise dimension of 1¼ inch.

Thus, it should be observed that the base 24 of the container 20 of the present invention can be used to accommodate varying leadframe sizes by simply positioning the posts accordingly. By altering the location of the posts, the main components of the container 20 (e.g., the cover 26, planar wall 36 and step formation 42 of the base 24) can be used to transport and store more than one leadframe size. The positioning of the posts is achieved by a molding process of the present invention.

As mentioned above, the molding process of the present invention enables the fabrication of bases 24 having varying post configurations without having to redesign and re-fabricate the entire mold. For example, a mold halve used to mold the base 24 of the container 20 during a conventional injection molding process is preferred. The mold halve 64 can include a mold receptacle having a rectangularly-shaped body with a cavity formed therein. The mold halve can further include a mold insert having a rectangularly-shaped body which is sized to by snugly received within the cavity of the mold receptacle. The body of the mold insert preferably has four opening formations formed therein for creating the posts during the molding process.

During the molding operation, a standard injection molding machine is provided. A suitable mold insert can be chosen from a supply of inserts, or created, depending on the size and shape of the leadframe 22 being received by the container 20. The mold insert determines the spacing of the posts of the container 20. Once the mold insert is chosen, it is fitted into the cavity of the body of the mold receptacle. Once fitted, the injection molding machine can be operated in concert with a mating mold halve (not shown) to fabricate the base 24 of the container 20. The cover 26 is made pursuant to the injection molding process.

Thus, it should be observed that the container 20 disclosed herein provides an effective means of storing and transporting leadframes 22, and can be easily designed and changed so as to accommodate leadframes of varying shapes and sizes. It can therefore be seen that for these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A container for storing and transporting articles, said container comprising:

a base including a planar wall having an upwardly facing surface defined by a peripheral edge, and at least two upwardly extending, opposite posts secured to the upper surface of the planar wall, said posts being spaced interiorly from the peripheral edge of the upwardly facing surface, each post having an outwardly facing surface and an inwardly facing surface formed such that each post is tapered from the bottom of the post to the top of the post, the articles being positioned between the inwardly facing surfaces of the posts; and a cover releasably securable to said planar wall of the base, said cover including a top wall and a peripheral, downwardly extending wall formed to the outer periphery of the top wall, said peripheral wall being positioned adjacent the peripheral edge of the upwardly facing surface of the base and outwardly with respect to said posts of the base when securing the cover to the base.

2. A container as set forth in claim 1, wherein each of said at least two posts are integrally formed with the planar wall of the base.

3. A container as set forth in claim 1, wherein an obtuse angle is formed between said inwardly facing surface and said upper surface of said planar wall.

4. A container as set forth in claim 3, further comprising means for flexing the posts inwardly so that the inwardly facing surfaces of the posts become perpendicular to the upper surface of the planar wall.

5. A container as set forth in claim 4, the top wall of the cover having a lower surface, said means for flexing the posts inwardly comprising at least two detent members projecting downwardly from the lower surface of the top wall of the cover, one detent member for each post, each detent member engaging a post for slightly flexing the post inwardly so that the inwardly facing surfaces of the posts become perpendicular to the upper surface of the planar wall.

6. A container as set forth in claim 1, further comprising means for flexing the posts inwardly so that the inwardly facing surfaces of the posts become perpendicular to the upper surface of the planar wall.

7. A container as et forth in claim 6, the top wall of the cover having a lower surface, said means for flexing the posts inwardly comprising at least two detent members projecting downwardly from the lower surface of the top wall of the cover, one detent member for each post, each detent member engaging a post for slightly flexing the post inwardly so that the inwardly facing surfaces of the posts become perpendicular to the upper surface of the planar wall.

8. A container as set forth in claim 1, said base further having a downwardly extending, outwardly facing surface generally perpendicular to the upwardly facing surface, said peripheral wall of the cover being positioned in a face-to-face relation with respect to said outwardly facing wall of the base when securing the cover to the base.

9. A container as set forth in claim 8, said base and cover being generally rectangularly-shaped wherein said posts are positioned at opposite corners of the planar wall of the base.

10. A container as set forth in claim 3, wherein the obtuse angle is within a range of 91°–96°.

11. A container for storing articles comprising:

a base having an upwardly facing surface defined by a peripheral edge and at least two opposing posts supported on said base at a first end of each post, each post being tapered from said first end to a second end of each post; and a cover having a top surface defined by a peripheral edge and a peripheral wall extending generally downwardly from said peripheral edge of said top surface, said peripheral wall being constructed and arranged to be releasably securable to said upwardly facing surface of said base.

12. The container of claim 11, wherein each of said posts includes an outer surface disposed substantially perpendicular to said upwardly facing surface of said base and an inner surface disposed at an obtuse angle with respect to said upwardly facing surface of said base.

13. The container of claim 12, wherein the obtuse angle is approximately 91 degrees.

14. The container of claim 12, wherein the obtuse angle is within a range of 91°–96°.

15. The container of claim 12, wherein said cover is constructed and arranged to flex said at least two posts inwardly when said cover is secured to said upwardly facing surface of said base.

16. The container of claim 15, wherein said inner surfaces of each of said posts are substantially perpendicular to said upwardly facing surface of said base when said cover is secured to said base.

* * * * *